(12) United States Patent
Kim et al.

(10) Patent No.: US 8,034,680 B2
(45) Date of Patent: Oct. 11, 2011

(54) METHOD OF MANUFACTURING A MEMORY DEVICE

(75) Inventors: Kihwan Kim, Anyang-si (KR);
Youngsoo Park, Yongin-si (KR);
Junghyun Lee, Suwon-si (KR);
Changjung Kim, Yongin-si (KR); Bosoo Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/457,925

(22) Filed: Jun. 25, 2009

(65) Prior Publication Data
US 2010/0006810 A1    Jan. 14, 2010

(30) Foreign Application Priority Data
Jun. 25, 2008 (KR) .................. 10-2008-0060225

(51) Int. Cl.
*H01L 21/8234* (2006.01)

(52) U.S. Cl. . 438/237; 438/239; 438/240; 257/E21.645; 257/E21.646; 257/E27.084

(58) Field of Classification Search .................. 438/104, 438/239, 240, 237; 257/68, 71, 296, 906, 257/E21.645, E21.646, E27.084
See application file for complete search history.

(56) References Cited

U.S. PATENT DOCUMENTS

| | | | |
|---|---|---|---|
| 5,396,095 A | 3/1995 | Wolters et al. | |
| 5,508,540 A | 4/1996 | Ikeda et al. | |
| 6,185,122 B1 | 2/2001 | Johnson et al. | |
| 6,709,991 B1 | 3/2004 | Kawahara et al. | |
| 6,830,786 B2 | 12/2004 | Yuda et al. | |
| 7,077,904 B2 | 7/2006 | Cho et al. | |
| 7,265,403 B2 | 9/2007 | Ito | |
| 7,297,559 B2 | 11/2007 | Honma et al. | |
| 7,425,512 B2 | 9/2008 | Udayakumar et al. | |
| 7,807,995 B2 | 10/2010 | Mikawa et al. | |
| 2003/0089954 A1* | 5/2003 | Sashida | 257/369 |
| 2006/0097288 A1 | 5/2006 | Baek et al. | |
| 2006/0268594 A1 | 11/2006 | Toda | |
| 2007/0205456 A1* | 9/2007 | Lee et al. | 257/314 |
| 2009/0184396 A1 | 7/2009 | Kim et al. | |
| 2010/0065807 A1 | 3/2010 | Takagi et al. | |

FOREIGN PATENT DOCUMENTS

| | | |
|---|---|---|
| KR | 10-2005-0094690 | 9/2005 |
| KR | 10-2006-0003211 | 1/2006 |
| KR | 10-0564609 | 3/2006 |
| KR | 10-2006-0042734 | 5/2006 |
| KR | 10-2007-0014410 | 2/2007 |
| KR | 10-2007-0062435 | 6/2007 |
| WO | WO 2007/010746 | 1/2007 |

OTHER PUBLICATIONS

An English language abstract of Korean Publication No. 10-2004-0077462, published Sep. 4, 2004.
U.S. Office Action dated Jul. 19, 2010.
U.S. Office Action dated Dec. 29, 2010, U.S. Appl. No. 12/289,069.
Extended European Search Report for European Appln. No. 09163580.5 dated Aug. 3, 2011.

* cited by examiner

*Primary Examiner* — Khiem D Nguyen
(74) *Attorney, Agent, or Firm* — Harness, Dickey & Pierce, P.L.C.

(57) ABSTRACT

Provided are a memory device formed using one or more source materials not containing hydrogen as a constituent element and a method of manufacturing the memory device.

18 Claims, 6 Drawing Sheets

METHOD OF MANUFACTURING A MEMORY DEVICE

CROSS-REFERENCE TO RELATED PATENT APPLICATIONS

This non-provisional application claims priority to Korean Patent Application No. 10-2008-0060225, filed on Jun. 25, 2008, in the Korean Intellectual Property Office, the entire contents of which are herein incorporated by reference.

BACKGROUND

1. Field

Example embodiments relate to a memory device formed using a precursor not containing hydrogen as a constituent element for an interlayer insulating material, and a method of manufacturing the memory device.

2. Description of the Related Art

In general, a conventional semiconductor memory array includes a plurality of memory cells connected in a circuit. An example of a conventional semiconductor memory is a dynamic random access memory (DRAM). In the DRAM, a unit memory cell generally includes a switch and a capacitor. The DRAM is highly integrated and operates at a high speed, however, data stored in the DRAM is deleted when power is turned-off.

By contrast, data stored in a flash memory may be retained even when power is turned-off. Unlike a volatile memory, the flash memory has a non-volatile characteristic, but generally has lower integration and a lower operation speed than the DRAM.

Research is being conducted on non-volatile memory devices including a magnetic random access memory (MRAM), a ferroelectric random access memory (FRAM), a phase-change random access memory (PRAM), a resistance random access memory (RRAM), and the like.

RRAM is a resistive memory. RRAM uses a resistance variation characteristic wherein the RRAM resistance varies according to a voltage of a transition metal oxide. A general resistive memory node includes a switch structure and a memory element formed between a lower electrode and an upper electrode. An insulating material is formed between electrodes and between memory nodes, and the insulating material is generally referred to as an inter-metallic dielectric (IMD) or an inter-layer dielectric (ILD). Conventionally, silicon dioxide ($SiO_2$) is used as the IMD and ILD, wherein the $SiO_2$ is formed from a source material (precursor) including hydrogen by using plasma enhanced chemical vapor deposition (PECVD). An example of a source material is silane ($SiH_4$). However, since the source material including hydrogen is used to form the IMD and ILD, the hydrogen may permeate through the memory element and the switch structure after forming the memory device, thereby deteriorating the characteristics of the memory device.

SUMMARY

Example embodiments provide a memory device capable of preventing deterioration of characteristics thereof, and a method of manufacturing the memory device.

At least one example embodiment provides a method of manufacturing a memory device. The method includes forming a first electrode, forming a memory node on the first electrode and forming an insulating layer on the first electrode and the memory node from one or more source materials not containing hydrogen as a constituent element to substantially prevent hydrogen from permeating the memory node. The method further includes forming a second electrode on the memory node.

The source material may be $SiCl_4$, $Si_2Cl_6$, $Si(NO_2)_4$, $Si(N_2O_2)_2$, $SiF_4$, $SiF_6$, or $Si(CNO)_4$.

The memory node may include a memory element formed of a transition metal oxide having a resistance variation characteristic.

The memory node may include a memory element formed of an oxide of Ni, Cu, Ti, Hf, Zr, Zn, W, Co, Fe, Nb, Pr, Mn, Ta, Ru, Ca, Sr or a combination thereof.

The insulating layer may be formed by Chemical Vapor Deposition (CVD) or Atomic Layer Deposition (ALD).

The memory node may include a switch structure, an intermediate electrode, and a memory element. The forming the memory node may include forming the switch structure on the first electrode, forming the intermediate electrode on the switch structure, forming the memory element on the intermediate electrode and patterning the switch structure, the intermediate electrode, and the memory element.

According to another example embodiment, a memory device includes a first electrode, an oxide based memory node formed on the first electrode, an insulating layer on the memory node and a second electrode formed on the memory node. The insulating layer is formed from one or more source material not containing hydrogen as a constituent element.

According to another example embodiment, the memory node includes substantially no hydrogen at a depth greater than 2 nm from a surface of the memory node.

BRIEF DESCRIPTION OF THE DRAWINGS

The above and other features and advantages will become more apparent by describing in detail example embodiments thereof with reference to the attached drawings in which.

DETAILED DESCRIPTION

Example embodiments will be more clearly understood from the detailed description taken in conjunction with the accompanying drawings.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. The example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of, various embodiments will be described in detail with reference to the attached drawings. However, the embodiments are not limited to the example embodiments, but may be embodied in various forms. In the figures, if a layer is formed on another layer or a substrate, it means that the layer is directly formed on another layer or a substrate, or that a third layer non-intervening protective layer is interposed therebetween.

Hereinafter, a memory device according to an example embodiment and a method of manufacturing the memory device will be described more fully with reference to the accompanying drawings.

Figure 1:
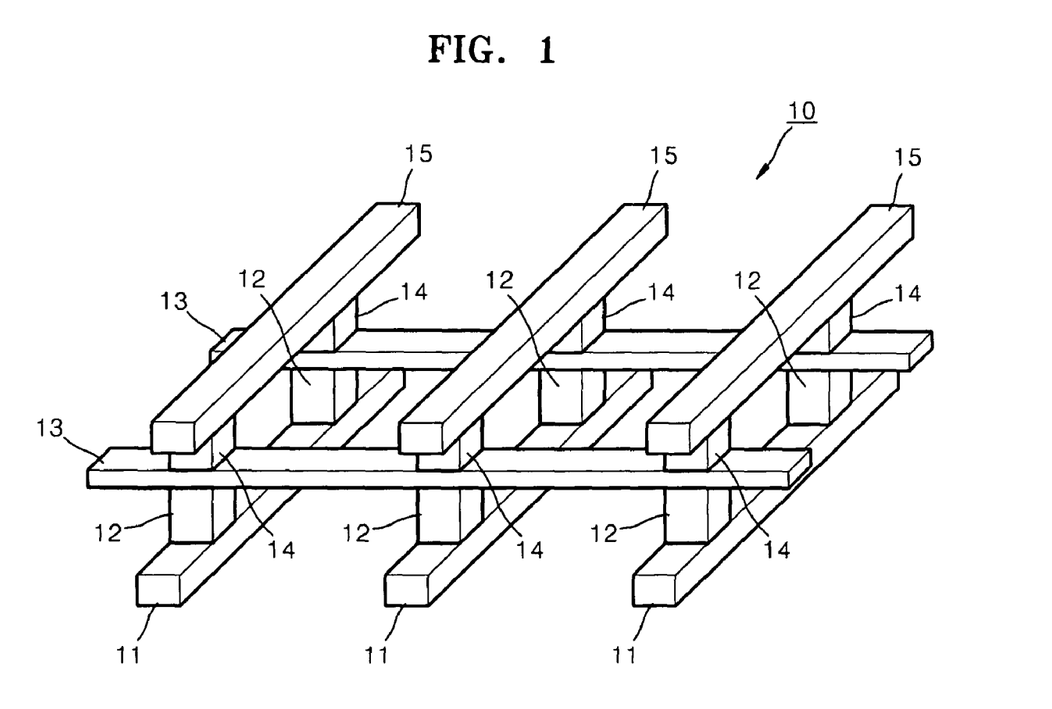
FIG. 1 illustrates a multi-level memory array structure according to an example embodiment.

FIG. 1 illustrates a multi-level memory array structure according to an example embodiment. Referring to FIG. 1, a multi-level memory array structure 10 may be a cross-point type memory array in which memory nodes 12 and second electrodes 13 are sequentially formed on first electrodes 11. The multi-level array structure 10 may further include memory nodes 14 and third electrodes 15 sequentially formed on the second electrodes 13. Each of the memory nodes 12 and 14 may include a memory element formed of a material having a resistance variation characteristic.

Figure 2:
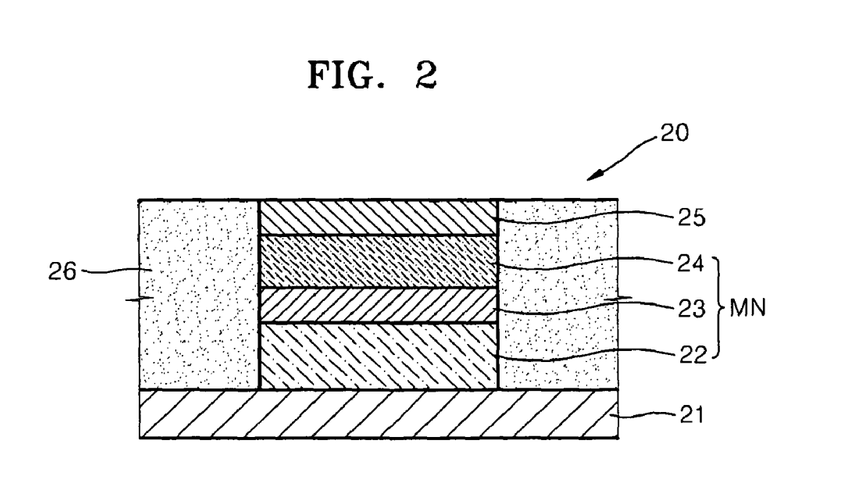
FIG. 2 illustrates a cross-sectional view of a memory device according to an example embodiment.

FIG. 2 illustrates a cross-sectional view of a resistive memory device according to an example embodiment. FIG. 2 illustrates a resistive memory device 20 having a Memory Node MN. The Memory Node MN may correspond to the Memory Node 12 illustrated in FIG. 1. As shown in FIG. 2, the memory node may include a switch structure 22, an intermediate electrode 23 and/or a memory element 24.

Referring to FIG. 2, the resistive memory device 20 may include the switch structure 22 formed on the lower electrode 21, and the intermediate electrode 23, the memory element 24, and an upper electrode 25 sequentially stacked on the switch structure 22. Locations of the switch structure 22 and the memory element 24 may be interchanged. An insulating material may be deposited in empty spaces along the first electrode 11, the memory node 12, and the second electrode 13 of FIG. 1. The empty spaces may be a similar space as the space occupied by insulating layers 26 in FIG. 2. The insulating layer 26 may be formed from one or more source materials not containing hydrogen as a constituent element. The insulating layer 26 may be formed from only one or more source materials not containing hydrogen as a constituent element. The insulating layer 26 may be formed on, for example, directly on, the memory node MN. Thus, there may be no intervening protective layer, a layer of $Al_2O_3$, or an equivalent thereof between the insulating layer 26 and the memory node MN. Alternatively, there may be an intervening layer, but not an intervening protective layer, a layer of $Al_2O_3$, or an equivalent thereof between the insulating layer 26 and the memory node MN.

Materials for forming each layer will be described in detail as follows. The lower electrode 21, the intermediate electrode 23, and the upper electrode 25 may be formed of electrode materials used to form a semiconductor, for example, a conductive metal oxide or a metal such as aluminum (Al), hafnium (Hf), zirconium (Zr), zinc (Zn), tungsten (W), cobalt (Co), gold (Au), platinum (Pt), ruthenium (Ru), iridium (Ir), or titanium (Ti).

The memory element 24 may be formed of a material used to form a resistive memory device. The memory element 24 may be formed of a transition metal oxide, for example, oxide of nickel (Ni), copper (Cu), Ti, Hf, Zr, Zn, W, Co, iron (Fe), niobium (Nb), manganese (Mn), tantalum (Ta), ruthenium (Ru) or a combination thereof. In example embodiments, the memory element 24 may be formed of one or more materials not containing a silicon-based material such as n+ type poly silicon. In example embodiments, the memory element 24 may be formed of only one or more materials not containing a silicon-based material such as n+ type poly silicon. In example embodiments, the memory element 24 may be formed of oxide of calcium (Ca), strontium (Sr), praseodymium (Pr), Ni, Cu, Ti, Hf, Zr, Zn, W, Co, Fe, Nb, Mn, Ta, Ru or a combination thereof.

The switch structure 22 may be a diode, such as a bilayered semiconductor diode including p-type and n-type semiconductor materials or a bilayered oxide diode including p-type and n-type oxides. The p-type oxide may be at least one of CuO and NiO, for example. The n-type oxide may be at least one of InZnO and TiO$_2$, for example. However, it should be understood that other oxides and combinations of oxides may be used in the switch structure 22.

The insulating layer 26 may be formed from one or more source materials not containing hydrogen as a constituent element. The insulating layer 26 may be formed from only one or more source materials not containing hydrogen as a constituent element. For example, the insulating layer 26 may be SiO$_2$ deposited using the source material by chemical vapor deposition (CVD). However, it should be understood that another deposition process such as atomic layer deposition (ALD) may be used. The source material may be SiCl$_4$, Si$_2$Cl$_6$, Si(NO$_2$)$_4$, Si(N$_2$O$_2$)$_2$, SiF$_4$, SiF$_6$, or Si(CNO)$_4$. Other source materials may include mixtures of at least silicon (Si) and nitrogen (N), mixtures of at least Si and fluorine (F), mixtures of at least Si and oxygen (O), mixtures of at least Si, N and O, mixtures not including Si(CNO)$_4$, mixtures not including SiCl$_4$, mixtures not including Si$_2$Cl$_6$, mixtures not including S, carbon (C), N and O, mixtures not including C, mixtures not including Si and chlorine (Cl), mixtures not including Cl, mixtures not including SiCl$_4$, SiCl$_6$ or Si(CNO)$_4$, and mixtures that are composed of less than 12.55 percent of H by atomic weight. During the CVD, the source material may be mixed with O$_2$ or H$_2$O. Since the one or more source materials do not contain hydrogen as a constituent element, deterioration of the memory element 24 and the switch structure 22 due to hydrogen may be reduced or prevented after forming the insulating layer 26.

A method of manufacturing a memory device according to an example embodiment will now be described with reference to FIGS. 3A through 3D in detail.

Figure 3A:
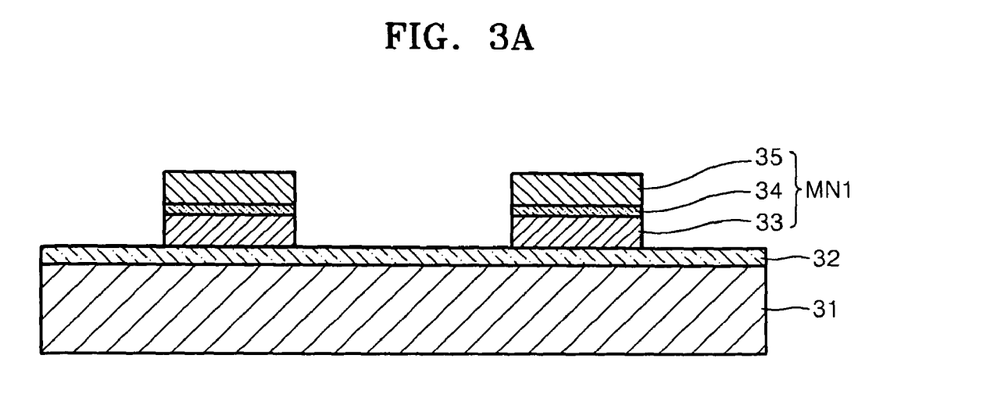
FIGS. 3A through 3D illustrate cross-sectional views of a method of manufacturing a memory device according to an example embodiment.

Referring to FIG. 3A, a lower electrode 32 is formed on a substrate 31. In more detail, a conductive material is deposited on the substrate 31 and then patterned to form a plurality of electrode lines like the first electrodes 11 of FIG. 1. After the lower electrode 32 is formed, a switch structure 33, an intermediate electrode 34, and a memory element 35 are sequentially deposited on the lower electrode 32 and patterned. The switch structure 33, the intermediate electrode 34 and the memory element 35 may form a memory node MN1. The lower electrode 32 and the intermediate electrode 34 may be formed of a conductive metal oxide or a metal such as Al, Hf, Zr, Zn, W, Co, Au, Pt, Ru, Ir, Ti, or the like.

The switch structure 33 may be a diode such as a bilayered semiconductor diode including p-type and n-type semiconductor materials or a bilayered oxide diode including p-type and n-type oxides. For example, the switch structure 33 may include a p-type semiconductor layer (e.g., a CuO layer) and an n-type semiconductor layer (e.g., an InZnO layer) that are stacked. The p-type oxide may be at least one of CuO and NiO, for example. The n-type oxide may be at least one of InZnO and TiO$_2$, for example. However, it should be understood that other oxides and combinations of oxides may be used in the switch structure 33.

The memory element 35 may be formed of a material having a resistance variation characteristic. The memory element 35 may be formed of a transition metal oxide, for example, oxide of nickel (Ni), copper (Cu), Ti, Hf, Zr, Zn, W, Co, iron (Fe), niobium (Nb) or a combination thereof. In example embodiments, the memory element 35 may be formed of one or more materials not containing a silicon-based material such as n+ type poly silicon. In example embodiments, the memory element 35 may be formed only of one or more materials not containing a silicon-based material such as n+ type poly silicon. In example embodiments, the memory element 24 may be formed of oxide of Ca, Sr, Pr, Ni, Cu, Ti, Hf, Zr, Zn, W, Co, Fe, Nb, Mn, Ta, Ru or a combination thereof.

Figure 3B:
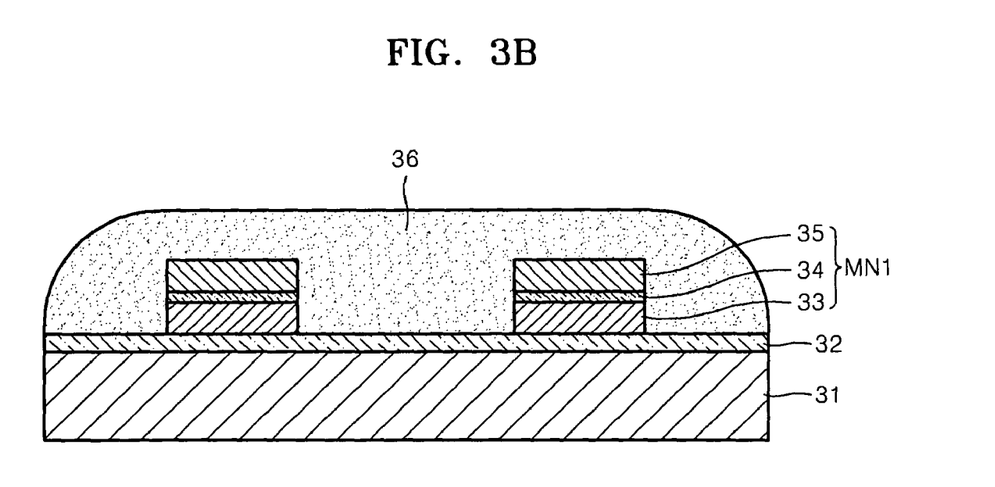

Referring to FIG. 3B, an insulating layer 36 is formed by depositing an insulating material on the substrate 31 by CVD. However, it should be understood that another process such as ALD may be used. The insulating layer 36 may also be formed on the memory node MN1. The insulating layer 36 may be formed from one or more source materials not containing hydrogen as a constituent element. The insulating layer 36 may be formed only from one or more source materials not containing hydrogen as a constituent element. For example, the insulating layer 36 may be SiO$_2$ deposited using a source material such as SiCl$_4$, Si$_2$Cl$_6$, Si(NO$_2$)$_4$, Si(N$_2$O$_2$)$_2$, SiF$_4$, SiF$_6$, Si(CNO)$_4$. The source material may be SiCl$_4$, Si$_2$Cl$_6$, Si(NO$_2$)$_4$, Si(N$_2$O$_2$)$_2$, SiF$_4$, SiF$_6$, or Si(CNO)$_4$. Other source materials may include mixtures of at least silicon (Si) and nitrogen (N), mixtures of at least Si and fluorine (F), mixtures of at least Si and oxygen (O), mixtures of at least Si, N and O, mixtures not including Si(CNO)$_4$, mixtures not including SiCl$_4$, mixtures not including Si$_2$Cl$_6$, mixtures not including S, carbon (C), N and O, mixtures not including C, mixtures not including Si and chlorine (Cl), mixtures not including Cl, and mixtures not including SiCl$_4$, SiCl$_6$ or Si(CNO)$_4$. During the CVD process, the source material is mixed with O$_2$ or H$_2$O.

Figure 3C:
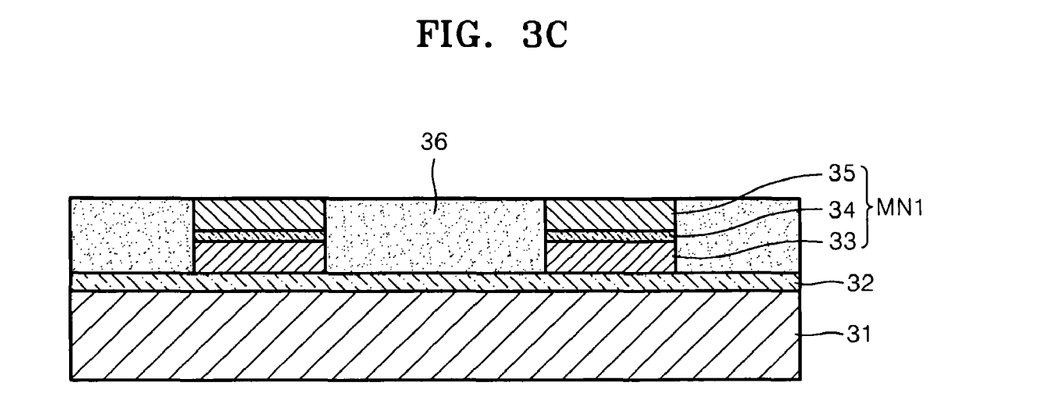

Referring to FIG. 3C, a surface of the memory element 35 may be exposed by performing a planarization process. The planarization process may be a chemical mechanical polishing (CMP) process.

Figure 3D:
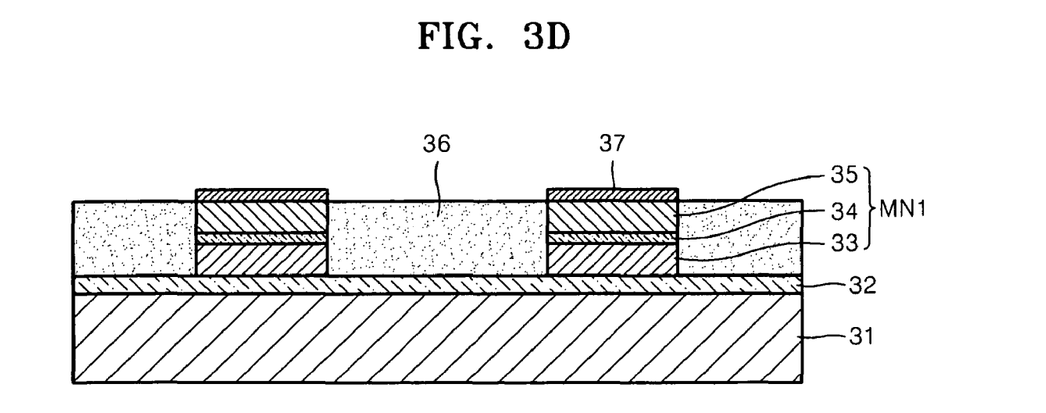

Referring to FIG. 3D, an upper electrode 37 may be formed by depositing and patterning a conductive material on the memory element 35. The upper electrode 37 may be formed of a conductive metal oxide or a metal such as Al, Hf, Zr, Zn, W, Co, Au, Pt, Ru, Ir, or Ti. When the lower electrode 32 is formed in a first direction, the upper electrode 37 may be formed in a second direction, normal to the lower electrode 32. Furthermore, a process for etching the insulating layer 36 may be further performed in order to form a pad connected with the lower electrode 32.

When a multi-level array structure is formed as illustrated in FIG. 1, a process for forming and patterning a switch structure, an intermediate electrode, and a memory element on the upper electrode 37 and then forming an insulating layer and an electrode is repeated. That is, after a first electrode and a memory node are sequentially formed, an insulating layer is formed lateral to the memory node, and then a second electrode is formed. After that, a memory node is formed on the second electrode, an insulating layer is formed lateral the memory node, and then a third electrode is formed on the memory node.

Figure 4:
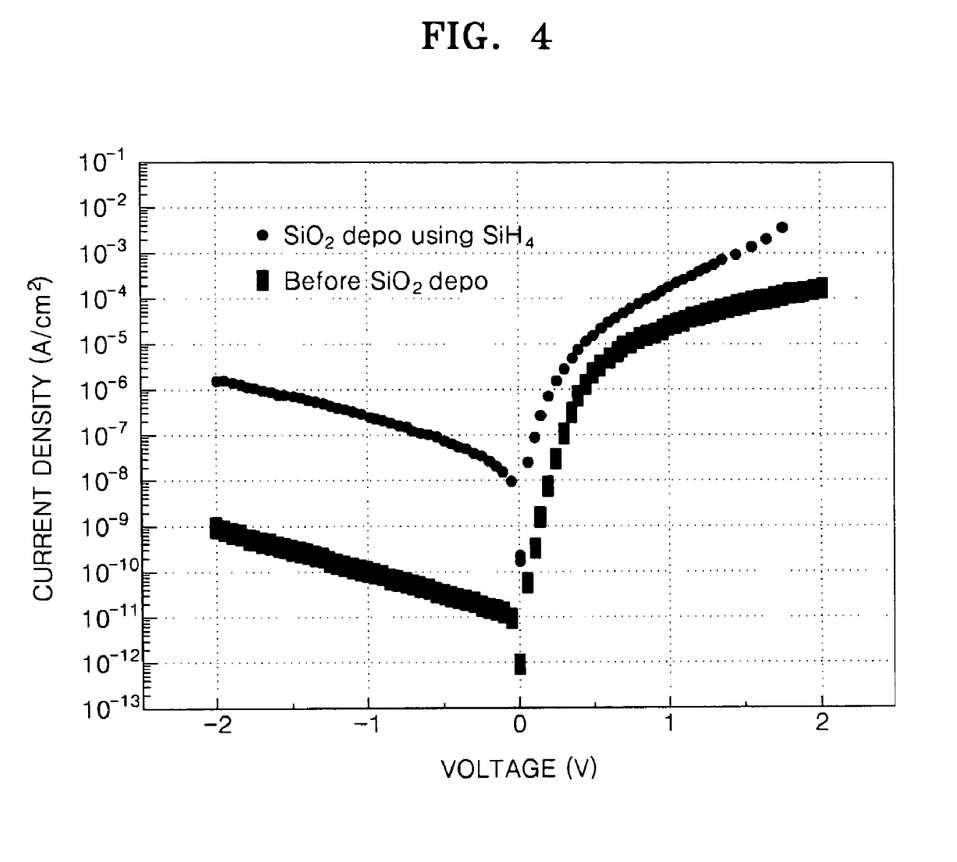
FIG. 4 is a graph showing current density versus applied voltage characteristics of a diode structure of a memory device according to a conventional technique.
Figure 5:
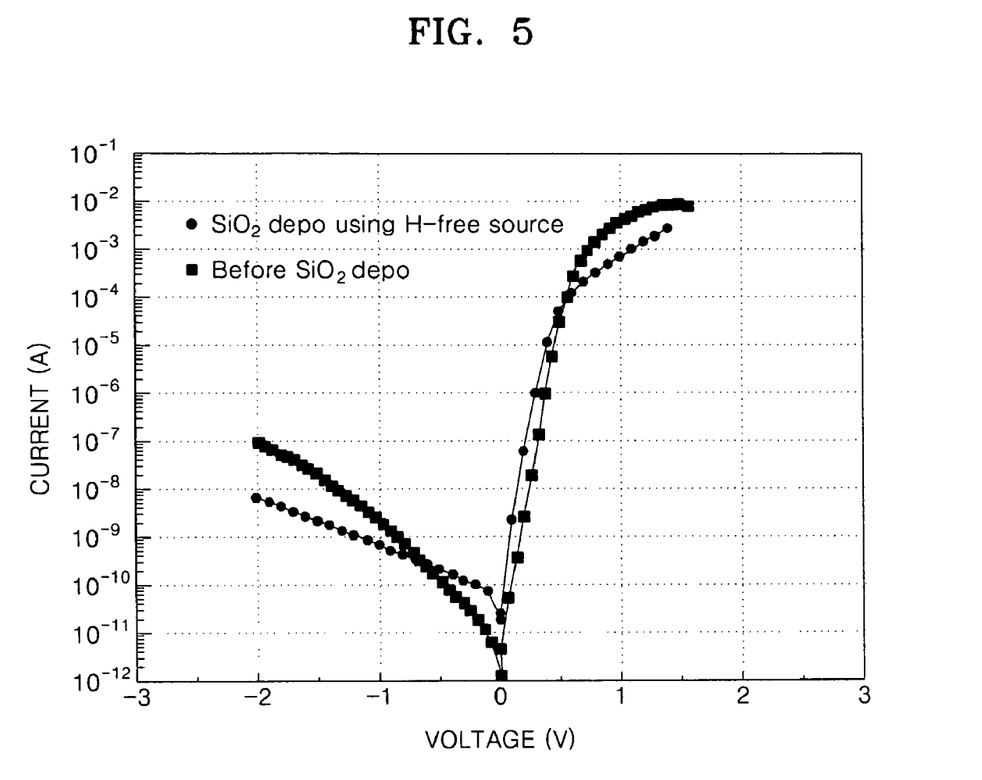
FIG. 5 is a graph showing current density versus applied voltage characteristics of a diode structure of a memory device according to an example embodiment.

FIGS. 4 and 5 are graphs showing electrical properties of a diode of a memory device according to a conventional technique and an example embodiment, respectively. In more detail, the graph is obtained by measuring current values to voltage applied to a test piece including an electrode formed of Pt and an oxide diode that may include a p-type semiconductor layer (e.g., a CuO layer) and an n-type semiconductor layer (e.g., an InZnO layer) that are stacked.

FIG. 4 is a graph showing current density versus applied voltage characteristics of a diode structure of a memory device according to a conventional technique.

FIG. 4 shows a result obtained by applying a voltage to the test piece including Pt formed in both sides of a bilayered diode including CuO and InZnO layers when an insulating layer is not formed (before SiO$_2$ deposition). Next, another result is obtained by forming an insulating layer in both sides of the bilayered diode including CuO and InZnO layers by using a $SiH_4$ source material in PECVD, and then applying a voltage to the both sides of the insulating layer ($SiO_2$ deposition using $SiH_4$). Referring to FIG. 4, in the case where the insulating layer is formed from a source material including hydrogen, the diode is deteriorated. Accordingly, variation in the plot of the case where the insulating layer is formed is greater than that in the plot of the case where the insulating layer is not formed.

FIG. 5 is a graph showing current density versus applied voltage characteristics of a diode structure of a memory device according to an example embodiment.

FIG. 5 shows a result obtained by applying a voltage to the test piece including Pt formed in both sides of a bilayered diode including CuO and InZnO layers when an insulating layer is not formed (before $SiO_2$ deposition). Next, another result is obtained by forming an insulating layer in both sides of the bilayered diode including CuO and InZnO layers by using a source material not containing hydrogen as a constituent element in CVD, and then applying a voltage to the both sides of the insulating layer ($SiO_2$ deposition using a source material not containing hydrogen as a constituent element). Referring to FIG. 5, in the case where the insulating layer is formed from a source material not containing hydrogen as a constituent element, the diode has an electrical characteristic having little variation compared to the case where the insulating layer is not formed.

As can be seen in FIG. 4, when an insulating layer is formed of a source material including hydrogen, a diode structure or a memory element material is deteriorated due to remaining hydrogen. Accordingly, when an insulating layer, such as IMD, ILD, or the like, is formed using a source material not containing hydrogen as a constituent element, a reliable memory device may be manufactured by preventing variation of a characteristic of a device before and after forming the insulating layer.

Figure 6:
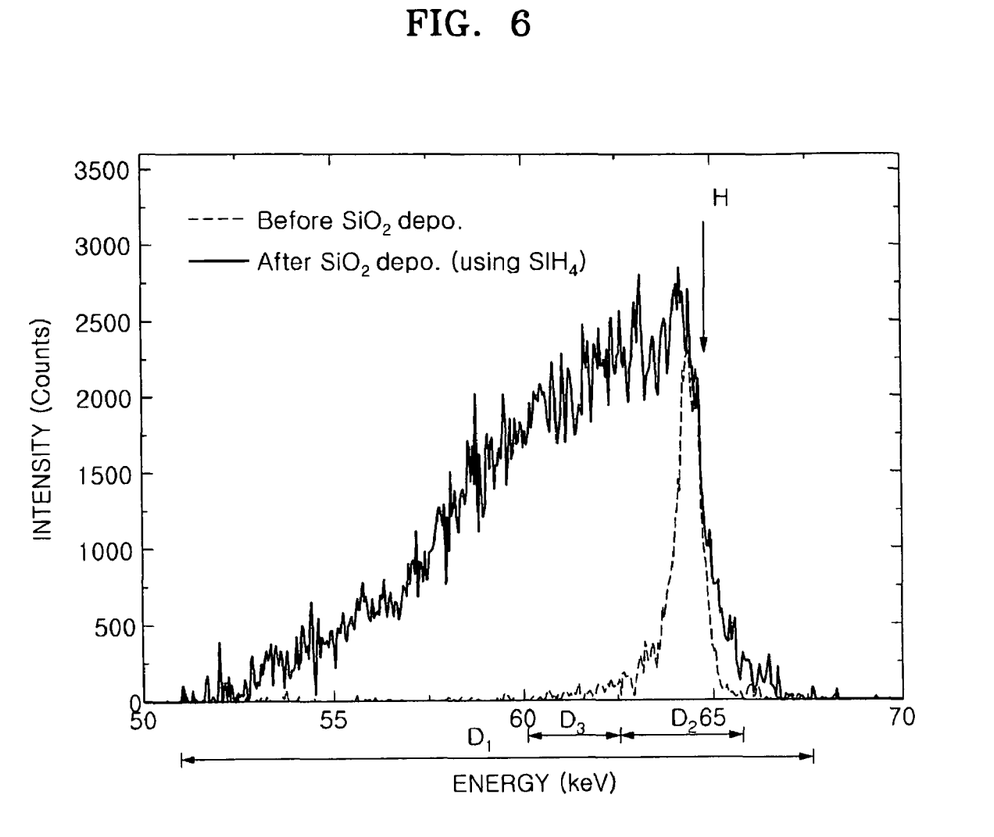
FIG. 6 is a graph showing a hydrogen density in a diode structure of a memory device according to an example embodiment.

FIG. 6 is a graph showing a hydrogen density in a diode structure of a memory device according to an example embodiment. FIG. 6 shows a result through Elastic Recoil Detection Analysis (ERDA) of the diode structure. The diode structure may be a bilayered diode including CuO and InZnO layers on a Pt electrode. In ERDA, $N^{3+}$ ions are injected into the bilayered diode and collide with hydrogen atoms. The $N^{3+}$ ions are emitted when they collide with the hydrogen atoms. And then, it is performed to detect energy of the emitted $N^{3+}$ ions. The deeper the hydrogen is in the bilayered diode, the smaller the energy of the $N^{3+}$ ion that is detected. Accordingly, when detected energy of the $N^{3+}$ ions is relatively high, hydrogens exist near the surface.

As shown in FIG. 6, a dotted line indicates ERDA performed on the bilayered diode before $SiO_2$ deposition (e.g., when an insulating layer is not formed). A solid line indicates ERDA performed on the bilayered diode after $SiO_2$ deposition (e.g., after an insulating layer is formed with $SiH_4$ as a source material) and the insulating layer is removed to expose the bilayered diode. In FIG. 6, energy (keV) corresponds to the depth of hydrogen existing from the surface of the bilayered diode and Intensity (Counts) corresponds to a relative density of hydrogen according to the depth. When hydrogens are present near the surface of the bilayered diode, the energy value of the emitted $N^{3+}$ ions may be approximately 65-67 keV.

Referring to FIG. 6, a D2 region represents a region from the surface of the bilayered diode to a depth of 1 nm and a D3 region having a depth of 1 nm-2 nm from the surface of the bilayered diode. As shown in FIG. 6, when the insulating layer is not formed (before $SiO_2$ depo), hydrogen from an ambient condition mostly exists in the D2 region and a very small amount of hydrogen exists in the D3 region.

In the case where the insulating layer is formed from a source material containing hydrogen as a constituent element (after $SiO_2$ depo), hydrogen exists over a D1 region. The D1 region represents a region from the surface of the bilayered diode to a depth of 7-10 nm. When the insulating layer is not formed (before $SiO_2$ depo), an atomic weight of hydrogen 1 nm below the surface of the bilayered diode is less than 1 percent of the atomic weight of the diode structure. Accordingly, when the insulating layer is formed by using a source material not containing hydrogen as a constituent element, an atomic weight of hydrogen 1 nm below the surface of a memory node including a diode structure may be less than 1 percent of the atomic weight of the diode structure.

While example embodiments have been particularly shown and described, the example embodiments and terms should not be construed as limiting the scope defined by the claims. For example, it should be understood, that a switch structure may be any type of threshold device and should not be limited to a diode. A method of manufacturing a memory device may be variously applied to not only a resistive memory device but also a memory device including a switch structure or a memory node which are formed of an oxide. Therefore, the scope of the example embodiments is defined not by the detailed description but by the appended claims, and all differences within the scope will be construed as being included in the example embodiments.

What is claimed is:

1. A method of manufacturing a memory device, the method comprising:
    forming a first electrode;
    forming a memory node on the first electrode;
    forming an insulating layer on the memory node from one or more source materials not containing hydrogen as a constituent element to substantially prevent hydrogen from permeating the memory node, the forming the insulating layer including forming the insulating layer directly adjacent the memory node, and
    forming a second electrode on the memory node;
    wherein the forming the memory node includes,
    forming a switch structure on the first electrode,
    forming an intermediate electrode on the switch structure,
    forming a memory element on the intermediate electrode, and
    patterning the switch structure, the intermediate electrode, and the memory element.

2. The method of claim 1, wherein the one or more source materials is $SiCl_4$, $Si_2Cl_6$, $Si(NO_2)_4$, $Si(N_2O_2)_2$, $SiF_4$, $SiF_6$, or $Si(CNO)_4$.

3. The method of claim 2, wherein the one or more source materials is $Si(NO_2)_4$, $Si(N_2O_2)_2$, $SiF_4$, or $SiF_6$.

4. The method of claim 1, wherein the forming the insulating layer includes mixing the source material with $O_2$ or $H_2O$.

5. The method of claim 1, wherein the memory node includes a memory element formed of a transition metal oxide having a resistance variation characteristic.

6. The method of claim 1, wherein the memory node includes an oxide of at least one of Ni, Cu, Ti, Hf, Zr, Zn, W, Co, Fe Nb, Pr, Mn, Ta, Ru, Ca, Sr.

7. The method of claim 1, wherein the forming the insulating layer includes using chemical vapor deposition (CVD).

8. The method of claim 7, wherein using CVD includes mixing the source material with $O_2$ or $H_2O$.

9. The method of claim 1, wherein
    forming the switch structure includes forming a bilayered oxide diode, and forming the memory element includes forming a memory element of a transition metal oxide.

10. The method of claim 9, wherein the forming the second electrode includes depositing and patterning a conductive material on the memory element.

11. The method of claim 9, wherein the forming the bilayered oxide diode includes forming a bilayered structure of a p-type layer and an n-type layer.

12. The method of claim 1, wherein the forming the second electrode includes depositing and patterning a conductive material on the memory node.

13. The method of claim 1, wherein the forming the memory node includes forming the memory node to include less than one percent hydrogen by atomic weight one nanometer below a surface of the memory node.

14. A method of manufacturing a multi-level memory array, the method comprising:
performing the method of claim 1;
forming a second memory node on the memory device;
forming an insulating layer on the second memory node; and
forming a third electrode on the second memory node.

15. A method of manufacturing a memory device, the method comprising:
forming a memory node on a substrate; and
forming an insulating layer directly adjacent the memory node by depositing an insulating material on the substrate of the memory device by chemical vapor deposition (CVD), the insulating material being formed from one or more source materials not containing hydrogen as a constituent element,
wherein the forming the memory node includes,
forming a switch structure on a first electrode, the first electrode being on the substrate,
forming an intermediate electrode on the switch structure,
forming a memory element on the intermediate electrode, and
patterning the switch structure, the intermediate electrode, and the memory element.

16. The method of claim 15, wherein the one or more source materials is $SiCl_4$, $Si_2Cl_6$, $Si(NO_2)_4$, $Si(N_2O_2)_2$, $SiF_4$, $SiF_6$, or $Si(CNO)_4$.

17. The method of claim 15, wherein the forming the insulating layer includes mixing the one or more source materials with $O_2$ or $H_2O$.

18. The method of claim 15, wherein the forming the memory node includes forming the memory node to include less than one percent hydrogen by atomic weight one nanometer below a surface of the memory node.

* * * * *